United States Patent [19]
LeMay et al.

[11] Patent Number: 6,111,378
[45] Date of Patent: Aug. 29, 2000

[54] WINDOW WIPER MOTOR SYSTEM FOR AN AUTOMOTIVE VEHICLE

[75] Inventors: Philip LeMay, Willington; H. Winston Maue, Farmington Hills, both of Conn.

[73] Assignee: UT Automotive Dearborn, Inc., Dearborn, Mich.

[21] Appl. No.: 08/879,548

[22] Filed: Jun. 20, 1997

Related U.S. Application Data

[63] Continuation-in-part of application No. 08/431,149, Apr. 28, 1995, Pat. No. 5,764,010.

[51] Int. Cl.$^7$ ....................................................... H02P 1/04
[52] U.S. Cl. .......................... 318/443; 318/444; 318/483; 15/250.17; 307/9.1; 307/10.1
[58] Field of Search ..................................... 318/444, 443, 318/483; 15/250.17; 307/9.1, 10.1

[56] References Cited

U.S. PATENT DOCUMENTS

| | | |
|---|---|---|
| 2,659,237 | 11/1953 | Wood . |
| 3,421,380 | 1/1969 | Mansour . |
| 3,442,146 | 5/1969 | Simpson . |
| 3,443,442 | 5/1969 | Schweihs . |
| 3,443,455 | 5/1969 | Zugel . |
| 3,574,882 | 4/1971 | Petry . |
| 3,665,772 | 5/1972 | Beard et al. . |
| 3,688,332 | 9/1972 | Bellware . |
| 3,689,817 | 9/1972 | Elliott . |
| 3,694,723 | 9/1972 | Schneider et al. . |
| 3,803,627 | 4/1974 | Schuscheng . |
| 3,917,330 | 11/1975 | Quantz . |
| 3,927,436 | 12/1975 | Inoue et al. . |
| 4,009,952 | 3/1977 | Badalich et al. . |
| 4,158,159 | 6/1979 | Orris et al. . |

(List continued on next page.)

FOREIGN PATENT DOCUMENTS

| | | |
|---|---|---|
| 0 252 481 A2 | 1/1988 | European Pat. Off. . |
| 0 558 181 A1 | 9/1993 | European Pat. Off. . |
| 822 178 | 11/1951 | Germany . |
| 32 08 121 A1 | 9/1983 | Germany . |
| 3807087 A1 | 9/1989 | Germany . |

(List continued on next page.)

OTHER PUBLICATIONS

"Goodheart–Wilcox Automotive Encyclopedia", William K. Toboldt, Larry Johnson, Steven W. Olive, 1989, pp. 723–726.

"Automotive Handbook", Bosch 3rd Edition, 1993, pp. 694–697.

"Kinematic Analysis of Mechanisms", 1959, J.E. Shigley, pp. 228–231.

"Genevamation Indexing Drives", Jan. 12, 1995 Catalog No. 693, Geneva Mechanisms Corporation.

"Saab Owners Workshop Manual", Haynes Publishing Group 1981, 1986, pp. 172–174, 237.

Machine Design, "Basic of Design Engineering", Jun. 1992, Article "Mechanical Systems".

A paper from the Third Conference on Mechanisms, "A Survey of Intermittent–Motion", F.J.Bogardus, 1956, pp. 8–15.

Machine Design, Mechanisms for Intermittent Motion, Dec. 1951, Otto Lichtwitz, pp. 134–148.

"Mechanisms for Providing Intermittent Rotary Motion", Product Engineering, Aug. 1949, pp. 116–117.

Machine Design, Mechanisms for Intermittent Motion, "Part 2", Jan. 1952, Otto Lichtwitz, pp. 127–141.

(List continued on next page.)

*Primary Examiner*—Karen Masih
*Attorney, Agent, or Firm*—Harness, Dickey & Pierce, P.L.C.

[57] ABSTRACT

A window wiper motor system for an automotive vehicle includes an incremental wiper position detection device. A window wiper feedback pattern is disposed on a stationary circuit board mounted within a gear enclosure with its electronic components facing inwardly toward a main gear. A low profile, flip chip integrated circuit attachment to the printed circuit board is also provided.

5 Claims, 16 Drawing Sheets

U.S. PATENT DOCUMENTS

| | | |
|---|---|---|
| 4,173,055 | 11/1979 | Izumi et al. . |
| 4,183,114 | 1/1980 | Eden . |
| 4,259,624 | 3/1981 | Seibicke . |
| 4,271,381 | 6/1981 | Munz et al. . |
| 4,309,646 | 1/1982 | Liedtke et al. . |
| 4,329,631 | 5/1982 | Betsch et al. . |
| 4,336,482 | 6/1982 | Goertler et al. . |
| 4,352,299 | 10/1982 | Riggs et al. . |
| 4,422,522 | 12/1983 | Slavin et al. . |
| 4,434,678 | 3/1984 | Maus . |
| 4,492,904 | 1/1985 | Graham . |
| 4,573,723 | 3/1986 | Morita et al. . |
| 4,639,065 | 1/1987 | Kohler et al. . |
| 4,660,698 | 4/1987 | Miura . |
| 4,663,575 | 5/1987 | Juzswik et al. ............ 318/444 |
| 4,664,217 | 5/1987 | Welch et al. . |
| 4,700,026 | 10/1987 | Kamiyama et al. . |
| 4,702,117 | 10/1987 | Tsutsumi et al. . |
| 4,733,147 | 3/1988 | Muller et al. . |
| 4,810,563 | 3/1989 | DeGree et al. . |
| 4,866,357 | 9/1989 | Miller et al. . |
| 4,878,398 | 11/1989 | Heinrich . |
| 4,885,512 | 12/1989 | Gille et al. . |
| 4,893,039 | 1/1990 | Isii . |
| 4,897,842 | 1/1990 | Herz et al. ............ 318/444 X |
| 4,918,272 | 4/1990 | Nishikawa . |
| 5,007,131 | 4/1991 | Chevalier et al. . |
| 5,023,530 | 6/1991 | Ohashi et al. . |
| 5,063,317 | 11/1991 | Bruhn . |
| 5,169,465 | 12/1992 | Riley . |
| 5,182,957 | 2/1993 | Bohmer et al. . |
| 5,218,255 | 6/1993 | Horiguchi . |
| 5,222,775 | 6/1993 | Kato . |
| 5,228,239 | 7/1993 | Heo . |
| 5,251,114 | 10/1993 | Cantin et al. . |
| 5,274,875 | 1/1994 | Chou . |
| 5,291,109 | 3/1994 | Peter . |
| 5,333,351 | 8/1994 | Sato . |
| 5,355,061 | 10/1994 | Forhan . |
| 5,355,286 | 10/1994 | Flint . |
| 5,519,258 | 5/1996 | Stroven et al. . |
| 5,654,617 | 8/1997 | Mills ............ 318/444 |
| 5,694,012 | 12/1997 | Pientka et al. ............ 318/444 |

FOREIGN PATENT DOCUMENTS

| | | |
|---|---|---|
| 39 23 688 A1 | 1/1991 | Germany . |
| 43 13 363 A1 | 11/1993 | Germany . |
| 43 37 760 A1 | 5/1994 | Germany . |
| 195 18 330 A1 | 11/1995 | Germany . |
| WO 96/33891 | 10/1996 | WIPO . |
| WO 96/33892 | 10/1996 | WIPO . |
| WO 96/33893 | 10/1996 | WIPO . |

OTHER PUBLICATIONS

Machine Design, Mechanisms for Intermittent Motion, "Part 3", Feb. 1952, Otto Lichtwitz, pp. 146–155.

Machine Design, Mechanisms for Intermittent Motion, "Part 4", Mar. 1952, Otto Lichwitz, pp. 145–155.

A paper from the Third Conference on Mechanisms, "Designing for Intermittent Motion with Modified Starwheels", Karl E. Kist, pp. 16–20.

"Mechanisms for Engineering Design" "Motion, Circular, Intermittent", Chapter 3, S.B. Tuttle, John Wiley Co., pp. 33–51.

Machine Design, "Modifying Starwheel Mechanisms", Vandeman and Wood, Apr. 1952, pp. 255–261.

"Kinematics of Intermittent Mechanism III—The Spherical Geneva Wheel", Product Engineering, Oct. 1949, S. Rappaport, pp. 137–139.

Machine Design, "Mechanical Systems", Jun. 1992, pp. 130, 132, 168.

"Mechanisms and Dynamics of Machinery", Hamilton H. Mabie and Fred W. Ocvirk, John Wiley & Sons, 1957.

Panasonic Booklet, "Panasert Microelectronics Assembly System", Entire booklet, Dec. 15, 1995.

Thermal Clad Thermal Management Substrate, "Aluminum or Copper Base, Copper Clad Substrate", 2 pages, 1991.

Machine Design, "Potentiometer Takes the Heat", edited by Martha K. Raymond, Dec. 12, 1996, p. 54.

PCIM Power Conversion & Intelligent Motion Brochure, "Metal–Backed Boards Improve Thermal Performance of Power Semis", Sep. 1989.

Electronic Engineer's Handbook, Second Edition, 1982, "Discrete Circuit Components", pp. 7–80.

Exhibit A, 7 photographs showing BMW/Gate electric motor, prior to Jun. 20, 1997.

Exhibit B, 2 photographs showing a digital encoder, prior to Jun. 20, 1997.

Exhibit C, 1 photograph showing a flip chip, prior to Jun. 20, 1997.

Exhibit D, 2 photographs showing a digital encoder, prior to Jun. 20, 1997.

Exhibit E, 1 photograph showing a digital encoder, prior to Jun. 20, 1997.

Exhibit F, photographs/illuminations showing Aerospace and Consumer Electronics products, prior to Jun. 20, 1997.

The Bergquist Company, "Your Thermal Via is a Dead End without Bergquist Bond Ply", prior to Jun. 1997.

SAE Technical Paper Series 960390, "Liftgate Multiplexed Node", by H. Winston Maue, Feb., 1996, pp. 73–76.

WINDOW WIPER MOTOR SYSTEM FOR AN AUTOMOTIVE VEHICLE

This application is a continuation-in-part of U.S. Serial No. 08/431,149, now U.S. Pat. No. 5,764,010 entitled "Control System For An Automotive Vehicle Multi-Functional Apparatus," filed on Apr. 28, 1995, which is incorporated by reference herewithin.

BACKGROUND OF THE INVENTION

This invention relates generally to window wipers and specifically to a window wiper motor system for an automotive vehicle.

Almost all automotive vehicles have a single or a pair of windshield wiper assemblies. These assemblies traditionally include rubber wiper blades mounted upon claw brackets. These claw brackets are pivotably attached to wiper arms mounted upon rotating shafts. The shafts are either directly driven by electric motors or driven by a single electric motor which actuates a series or parallel-coupled four bar linkage mechanism. It is further known to provide a wiper system, in combination with a wash device, to clean headlamps for automotive vehicles.

It is also common to employ a window wiper assembly for cleaning rear windows of automotive vehicles. Typically, these types of rear window wiper assemblies include a wiper blade mounted upon a bracket which is coupled to a wiper arm. The wiper arm is attached to a wiper shaft rotatably driven in a cyclical oscillating manner by a helical gear. A reversible, fractional horsepower, direct current electric motor serves to actuate the helical gear through an armature shaft mounted worm gear enmeshed therewith. This type of rear window wiper arrangement is usually mounted upon a pivoting liftgate of a minivan, station wagon, sport-utility vehicle or the like. One such example is disclosed in U.S. Pat. No. 5,519,258 entitled "System and Method for Controlling Vehicle Lift Gate Window Wiper" which issued to Stroven et al. on May 21, 1996.

Some conventional vehicles also provide a rear window release lock or latch, actuated by a solenoid, which can be unlocked to allow for upward pivotal movement of a rear window in relation to the otherwise stationary liftgate. In combination therewith, a separate liftgate lock is often mounted upon the liftgate door for fastening the liftgate to the body thereby preventing inadvertent pivotal opening. This liftgate lock is traditionally operated by manual key or handle rotation, or through a separate electric motor or solenoid.

Separate motors or solenoids are commonly required to actuate these various locks and the wiper. The traditional need for such a multiplicity of electromagnetic devices has increased the automotive vehicle weight and cost while further proving difficult to package within the often small spaces provided. This added weight is especially detrimental when the window wiper mechanism, rear window lock and liftgate lock, as well as their distinct respective electromagnetic devices, are all incorporated within the pivoting liftgate. Not only is the piece cost increased due to this multiplicity of electromagnetic devices, but the assembly cost, part number proliferation and handling costs, electric wiring costs, objectional motor noise, and failure modes are increased. Furthermore, U.S. Pat. No. 3,688,332 entitled "Mechanism for Opening and Closing a Cover for a Concealed Windshield Wiper System" which issued to Bellware on Sep. 5, 1972, discloses a windshield wiper driven by an electric motor and an interruptable driving connection controlled by a separate electromagnet. This device further employed levers and pivot pins to open and close a cover.

More recently, WO 96/33891 entitled "Multi-Functional Apparatus Employing an Intermittent Motion Mechanism," WO 96/33893 entitled "Multi-Functional Apparatus Employing an Electromagnetic Device," and WO 96/33892 entitled "Control System for an Automotive Vehicle Multi-Functional Apparatus," all of which were published on Oct. 31, 1996, disclose a significantly improved system wherein a single electromagnetic device can selectively operate intermittent motion mechanisms coupled to a window wiper, a door lock, a window release lock and the like.

Many conventional window wiper motor devices employ a conductive feedback disk mounted on and rotating with a main gear that drives a window wiper shaft. Multiple fingers or stationary contacts are fixed to a rigid printed circuit board or the gear housing for indicating the end of sweep positions of the main gear. Such a device is shown in U.S. Pat. No. 4,259,624 entitled "Arrangement For Wiping A Vehicle Window," which issued to Seibicke on Mar. 31, 1981. This limit switch-type arrangement merely acts as an on/off switch to determine whether the wiper and driving gear have reached the end of their mechanically predetermined and fixed travel; intermediate incremental wiper positions cannot be determined within the wiping sweep range. Therefore, if the wiping travel distance or range is different between vehicles, then the rotating conductive disk must be mechanically changed in length and replaced. This increases part numbers and manufacturing costs.

SUMMARY OF THE INVENTION

In accordance with the present invention, the preferred embodiment of a window wiper motor system for an automotive vehicle includes an incremental wiper position detection device. In another aspect of the present invention, a window wiper feedback pattern is disposed on a stationary circuit board. In a further aspect of the present invention, a printed circuit board is mounted within a gear enclosure with its electronic components facing inwardly toward a main gear. In still another aspect of the present invention, a circuit board is affixed to a gear enclosure within a wiper motor as a single piece. In still another aspect of the present invention, a low profile, flip chip integrated circuit attachment to the printed circuit board is provided. A method of operating the window wiper motor system of the present invention is also provided.

The incremental wiper position sensing feature of the present invention is advantageous over traditional feedback disk arrangements in that the present invention allows for adjustment of the wiper sweep angles or end of range distances between different vehicles by the use of reprogrammable software variables. Thus, the identical mechanical components can be employed for many different vehicle wiper travel distances, thereby saving cost and assembly complexity while promoting greater flexibility of use. Furthermore, such incremental sensing allows for a determination of the rate of angular travel, such as speed or velocity, of the wiper wherein arbitrary motion profiles can be automatically adjusted in a real-time, constant feedback manner. Thus, the wiper speed can be varied at different points in its travel. This can be used to provide localized oscillation for ice removal or for detecting the wiper's rate of travel due to wet versus dry window conditions; such wet/dry sensing and control can be employed with an automatic on/off wiping and rain sensing feature. The system of the present invention can also be used to monitor and compensate for long time speed degradation of the electric motor and mechanism.

The present invention is further advantageous by providing a significantly thinner package as compared to conventional wiper motors. It has been found that the use of the flip chip integrated circuit attachment, inwardly projecting electronics, H-bridge MOSFET semiconductor and integrated heat sink configuration of the present invention reduces the part thickness by ¾ inch as compared to traditional surface mount electronics, add-on heat sinks and outwardly extending relays. The present invention provides additional advantages by directly employing the gear housing as a heat sink through integration with the circuit board. Thus, the present invention achieves lower electronic operating temperatures and higher packaging densities.

Another advantage of the present invention is that it combines many different functions into a single electronic control unit. A single electric motor is controlled by the present invention thereby synergistically replacing the traditional separate rear wiper motor, liftgate lock motor and rear window lock solenoid. Since an electronic control unit is required to operate the single electric motor, it is cost effective to also use this electronic control unit as a multiplexed rear node for a lift gate rear window wiper system. Accordingly, the present invention significantly reduces the piece cost, assembly cost, part proliferation and handling costs, and wiring costs as compared to non-multiplexed and multiple electromagnetic device constructions. Additional advantages and features of the present invention will become apparent from the following description and appended claims, taken in conjunction with the accompanying drawings.

DETAILED DESCRIPTION OF THE PREFERRED EMBODIMENT

Figure 1:
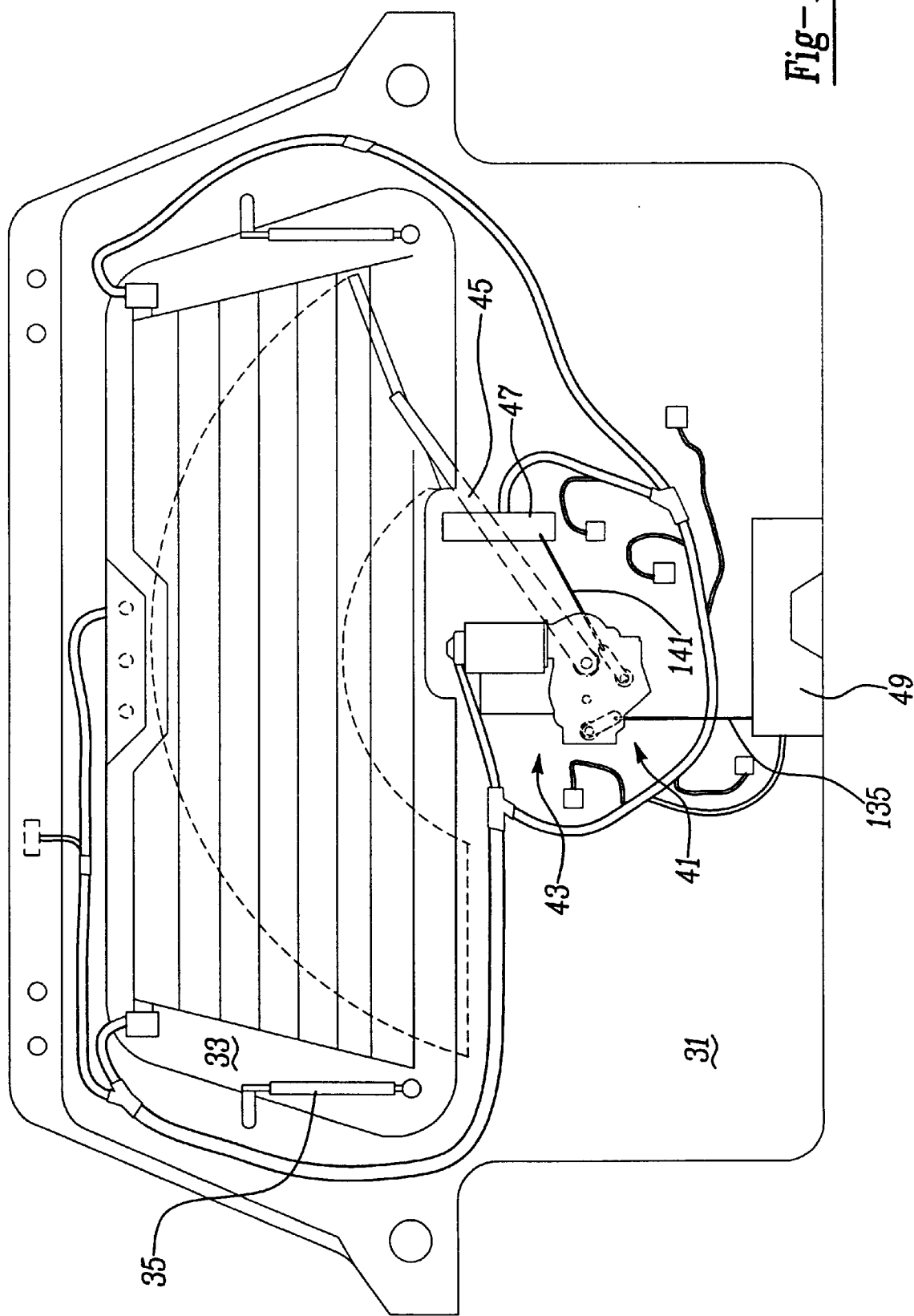
FIG. 1 is a front elevational view showing the preferred embodiment of a window wiper motor system for an automotive vehicle of the present invention.

An automotive vehicle, such as a minivan or the like, has a rear liftgate door which can pivot about an upper pair of hinges coupled to the vehicle body structure. When the liftgate is pivoted to an open position, a cargo space is accessible from behind the vehicle. Such a liftgate is shown in FIG. 1. Liftgate 31 has a rear window or back light 33 pivotable between a closed position, substantially flush with the outer surface of liftgate 31, to an open position about the upper hinges. A pair of pneumatic cylinders 35 act to push window 33 toward the open position when a lower portion of window 33 is released. A multi-functional window wiper motor system 41 of the present invention is mounted upon an inner surface of liftgate 31 and is operated by the preferred embodiment of a control system of the present invention. The majority of system 41 is hidden by an interior trim panel (not shown). System 41 includes a central drive and power transmission unit 43, a window wiper assembly 45, a window release latch or lock 47 and a liftgate lock 49, all of which are mounted upon liftgate 31. Examples of such locks (employing separate solenoids or motors, which would be removed in order to couple the lock mechanism for use with the present invention) are disclosed within the following U.S. patents: U.S. Pat. No. 5,222,775 entitled "Power Operated Latch Device for Automotive Back Door" which issued to Kato on Jun. 29, 1993; U.S. Pat. No. 4,422,522 entitled "Inertial Lock for Vehicle Door Latch" which issued to Slavin et al. on Dec. 27, 1983; and, U.S. Pat. No. 3,917,330 entitled "Electric Lock Release" which issued to Quantz on Nov. 4, 1975; all of which are incorporated by reference herewithin.

Figure 2:
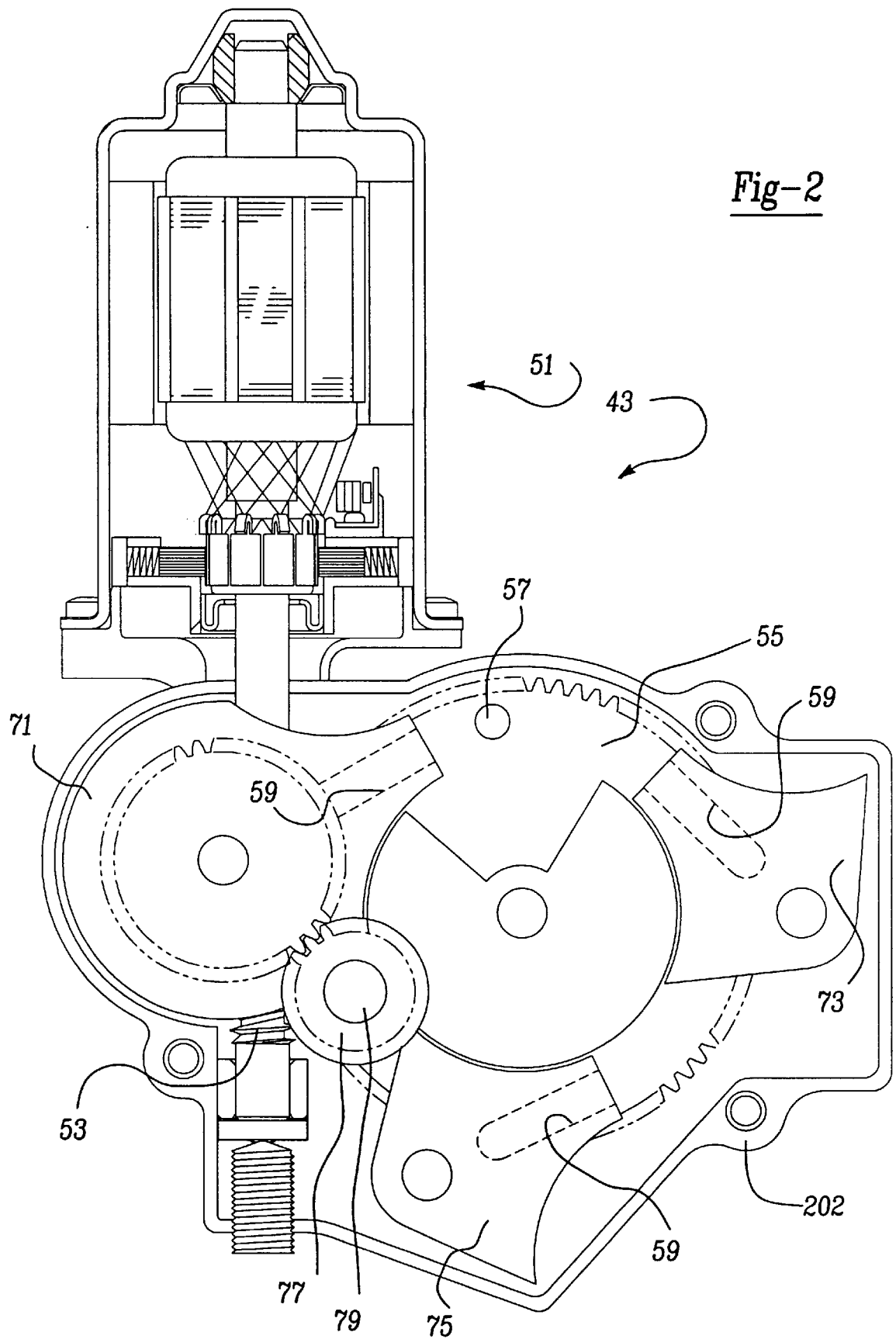
FIG. 2 is a rear elevational view, with covers removed therefrom, showing the preferred embodiment window wiper motor system.

The construction of a first preferred embodiment central drive and power transmission unit 43 is shown in FIG. 2. An electromagnetic device such as an electric motor 51 is of a conventional fractional horsepower, dc electromagnetic variety having a metallic motor housing within which are stationary permanent magnets, a rotatable armature with wire windings, a rotatable armature shaft member oined to the armature, a commutator electrically connected to the wire windings and rotatable with the armature shaft, a brush card assembly and various electronic components, bushings and retainers. It will be apparent to those skilled in the art that other electric motor constructions can be readily substituted for that shown.

A worm gear segment 53 is provided upon a portion of the armature shaft extending beyond the motor housing. A helical main gear member 55 is enmeshed with worm gear segment 53 within a gear housing section of a gear enclosure. Furthermore, a drive pin 57 protrudes from a face of main gear 55 for selectively engaging within a channel 59 of one of three rotatable intermittent motion mechanisms or cams 71, 73 or 75. Cam member 71 has a spur gear portion drivably enmeshed with a pinion gear member 77 which, in turn, rotates a rear wiper shaft member 79 coupled thereto by rivets, insert molding, a knurled press fit, et cetera. A liftgate door lock coupling assembly 135 couples movement of cam 73 to that of liftgate lock 49 as can be observed in FIGS. 1 and 2. Similarly, rear window lock coupling assembly 141 mechanically couples movement of cam 75 to that of window release lock 47. A second preferred embodiment central drive and power transmission unit includes an intermittent split shaft clutch mechanism (not shown).

FIGS. 3 through 7 illustrate a printed circuit board 201 laminated onto an aluminum gear cover 203 of the gear enclosure. Circuit board 201 includes a first circuit board layer 205, located closest to and parallel with cover 203, and a second parallel circuit board layer 207. Both layers 205 and 207 employ etched copper foil circuits on a high thermally conductive dielectric substrate. This metal cover backed circuit board assembly acts as a single piece, integrated heat sink, thereby allowing the large aluminum gear cover 203 to efficiently and directly dissipate heat generated by various transistors and other electronic components 209 mounted on second circuit board layer 207. Circuit board layers 205 and 207 are generally flexible until adhered onto cover 203. A ceramic filled, B-stage polymer is used between circuit board layers 205 and 207 to provide thermal conductivity. The metal mounted circuit board assembly can be constructed in accordance with U.S. Pat. No. 4,810,563 entitled "Thermally Conductive, Electrically Insulative Laminate," which issued on Mar. 7, 1989 to DeGree et al, which is incorporated by reference herewithin.

Figure 3:
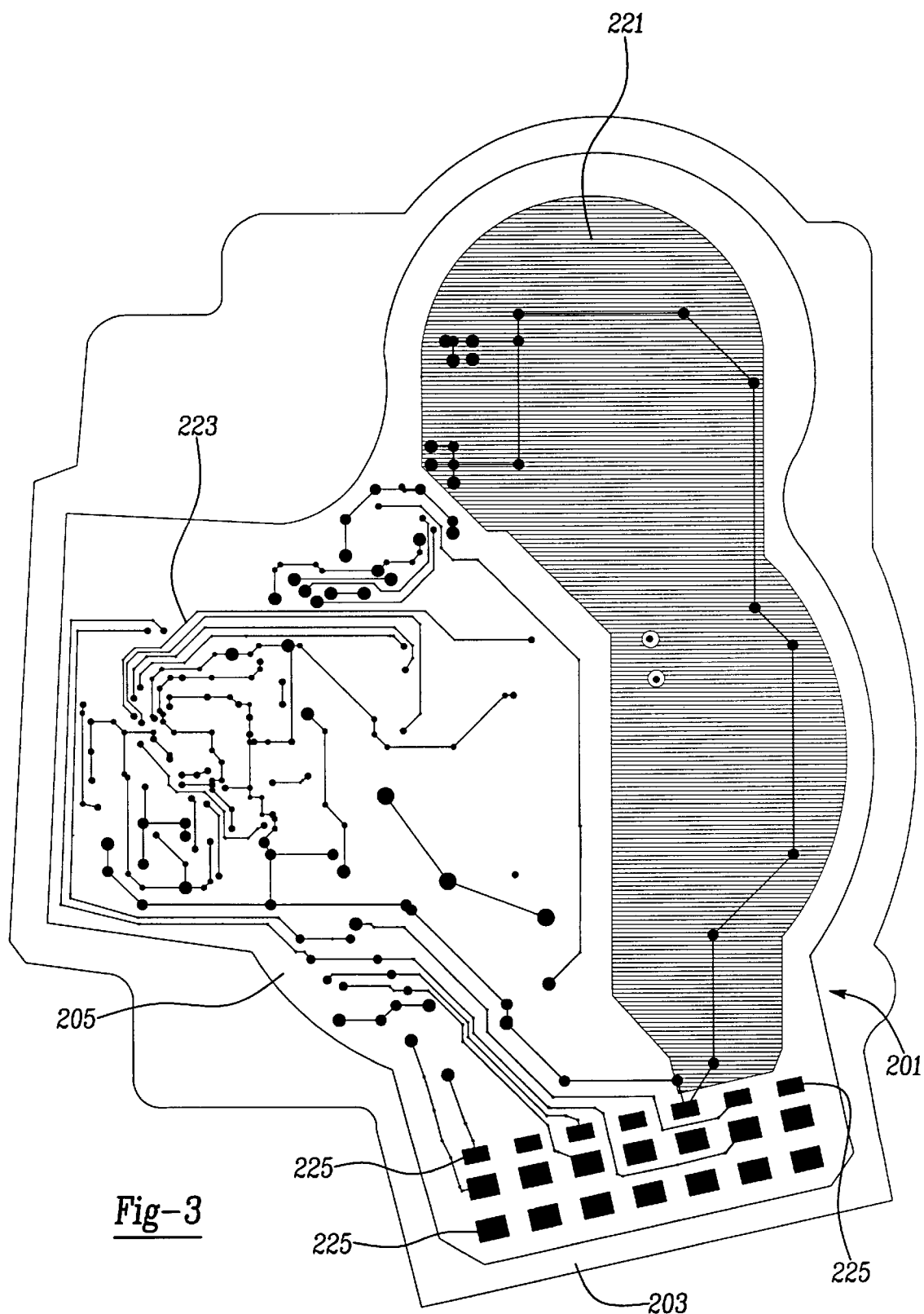
FIG. 3 is a true elevational view showing a first circuit board layer and cover employed in the preferred embodiment window wiper motor system.
Figure 4:
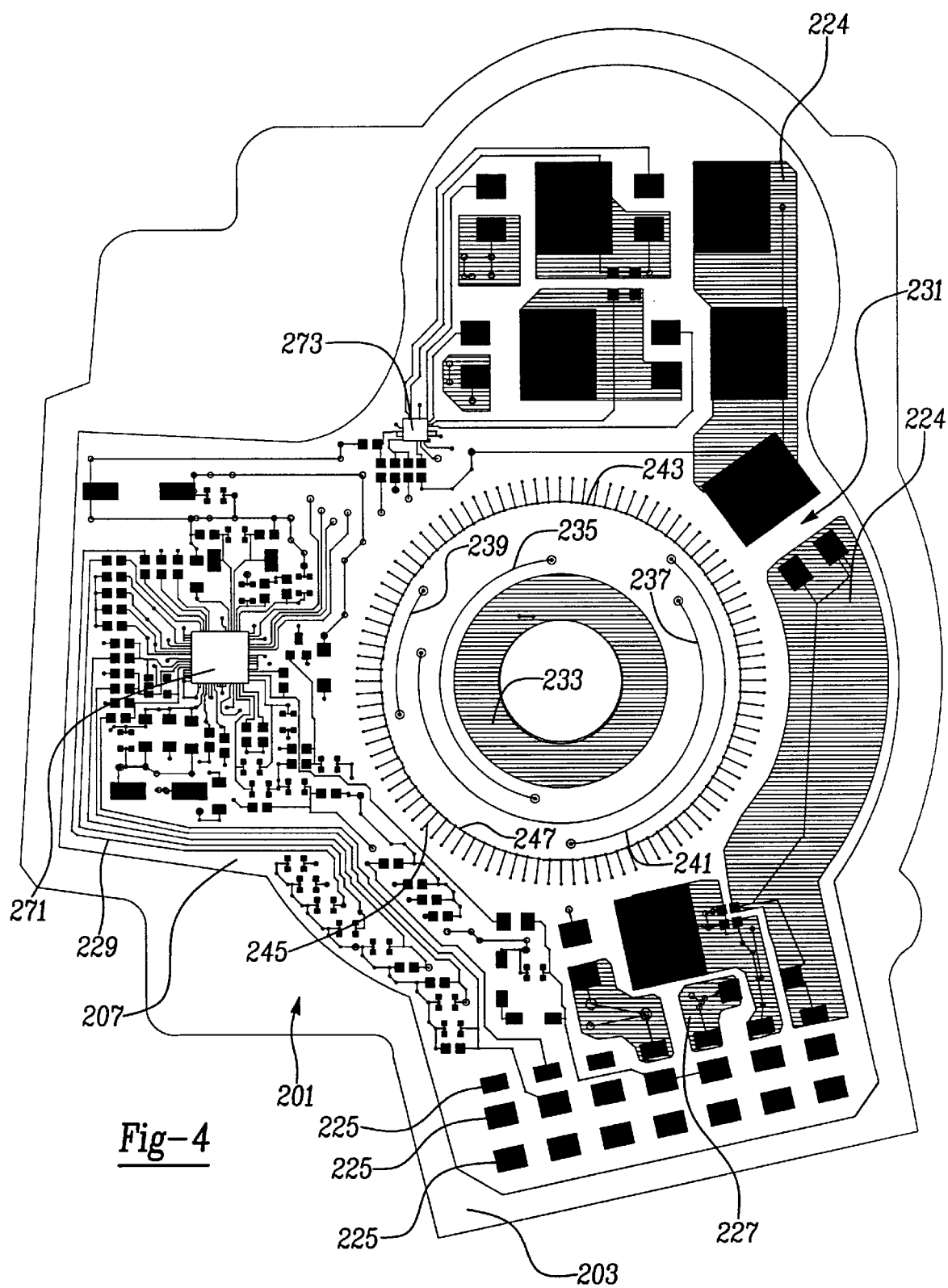
FIG. 4 is a true elevational view showing a second circuit board layer and the cover employed in the preferred embodiment window wiper motor system.

Referring to FIG. 3, circuit board layer 205 has a ground plane 221, various trace patterns 223 and a set of terminal pads 225. FIG. 4 shows multiple positive power pads 224, multiple ground pads 227, terminal pads 225 and a plurality of conductive traces 229. Additionally, a conductive feedback pattern 231 is disposed on circuit board layer 207.

Feedback pattern 231 has an annular rounded shorting ring 233, also denoted as POS 4, a first arcuate trace 235, also denoted as POS 1, a second arcuate trace 237, also denoted as POS 2, third and fourth arcuate traces 239, 241, also denoted as POS 3, and an interval position ring 243, also denoted as POS 5. A set of radially extending conductive tics 245 are coupled together by a circular conductive trace 247 for interval position ring 243. Tics 245 are equally spaced from each other and are disposed entirely around 360°. Arcuate traces 235 through 241 provide course absolute on/off signals indicative of whether main gear 55 (see FIG. 2) is within a predetermined window wiping, door lock actuating, window lock release or dwell positional ranges. However, tics 245 provide incremental signals indicative of the exact location of main gear 55, as well as the devices driven therefrom, such as the window wiper, door lock, window release device or intermittent motion mechanisms, within each positional range.

Figure 7:
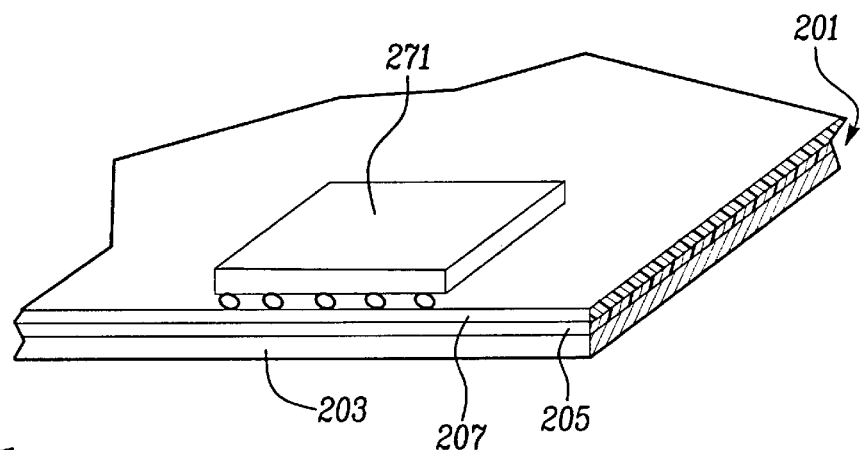
FIG. 7 is a diagrammatic and fragmentary perspective view showing the circuit layers and microprocessor employed in the preferred embodiment window wiper motor system.
Figure 8:
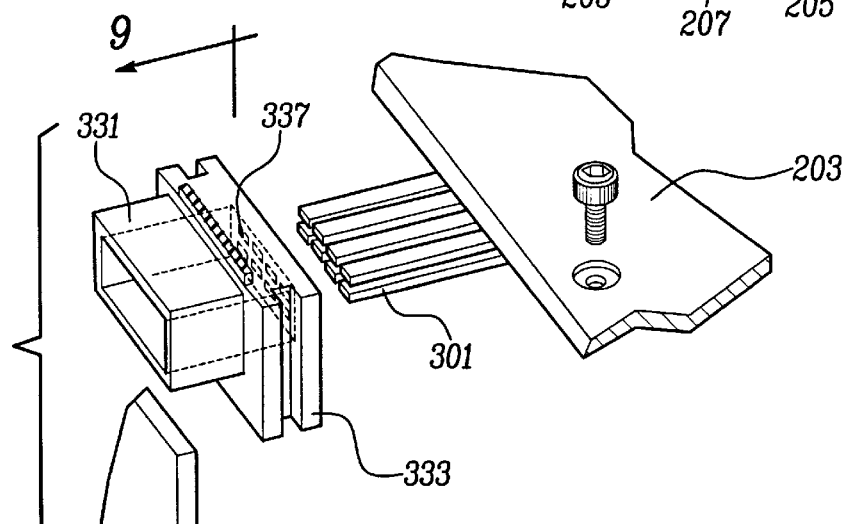
FIG. 8 is a fragmentary and exploded perspective view showing the preferred embodiment window wiper motor system.
Figure 9:
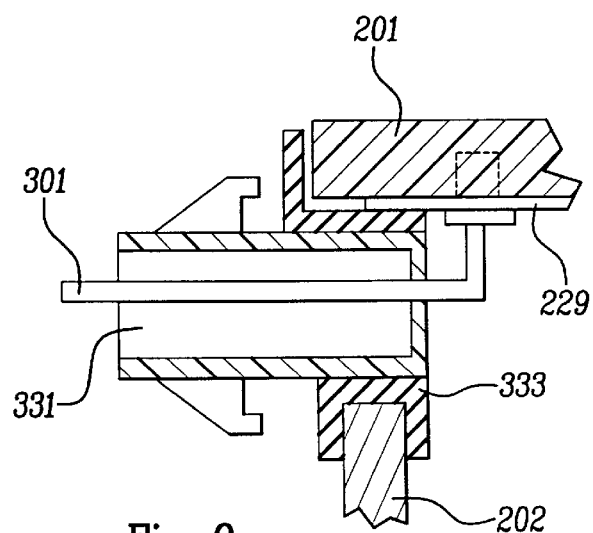
FIG. 9 is a cross sectional view, taken along line 9—9 of FIG. 8, showing the preferred embodiment window wiper motor system.

A main microprocessor 271 and a smaller transistor driving integrated circuit 273 are mounted upon circuit board layer 207 in a "flip chip" manner using unpackaged silicon integrated circuits and conductive adhesive attachments, as is shown in FIG. 7. A singulated silicon integrated circuit is thermosonically bonded to create gold stud bumps. The stud bumps are then planarized with a press. Next, the studs are dipped into a conductive epoxy whereafter the silicon integrated circuit is aligned to the circuit pattern. The conductive epoxy is cured and a non conductive under-fill material is then applied and cured. A "Panasert FCB-s" flip chip bonder from Panasonic can be used.

Figures 5, 5A:
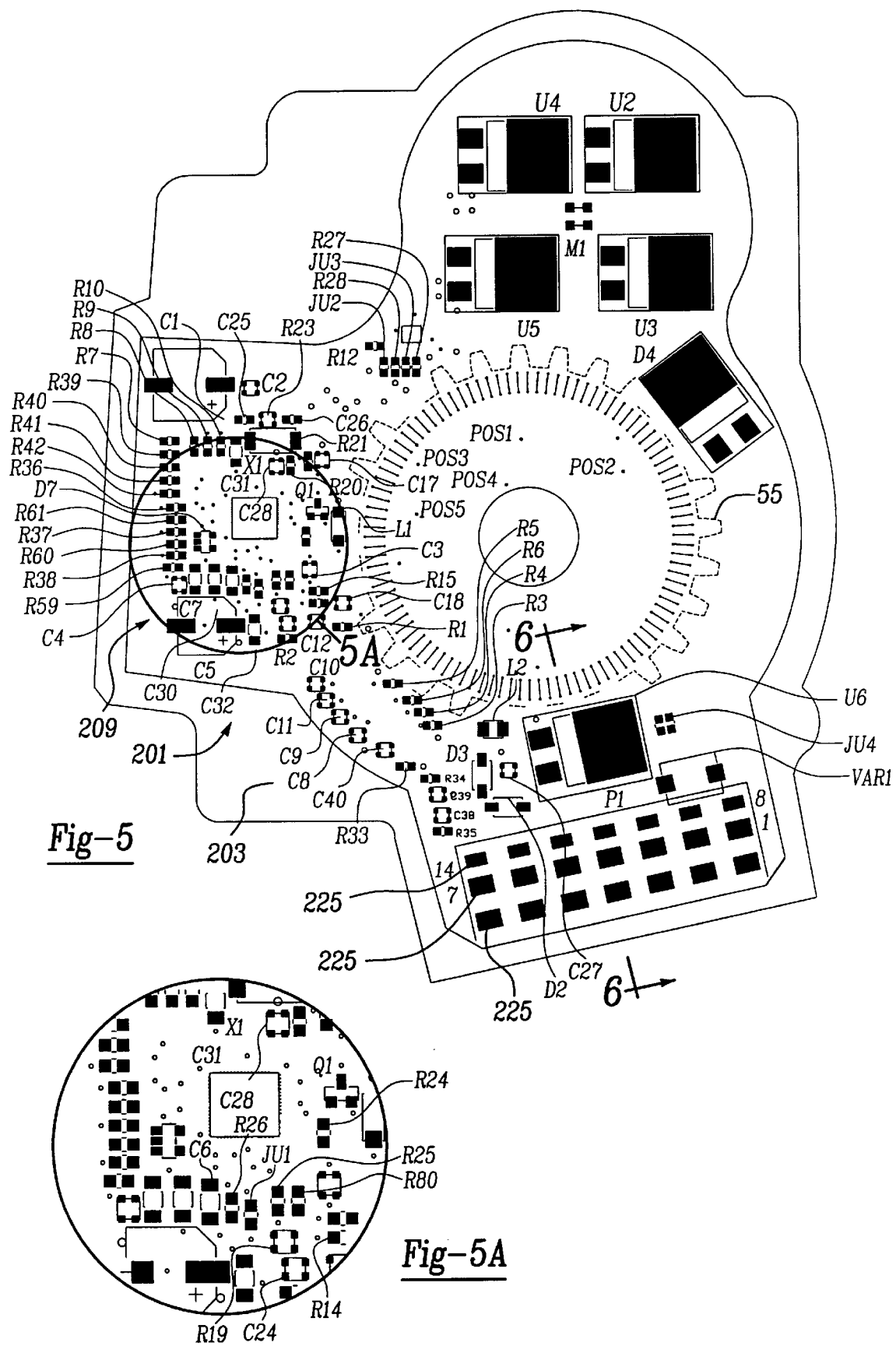
FIG. 5 is a true elevational view showing electronic components and the cover employed in the preferred embodiment window wiper motor system.
Figure 6:
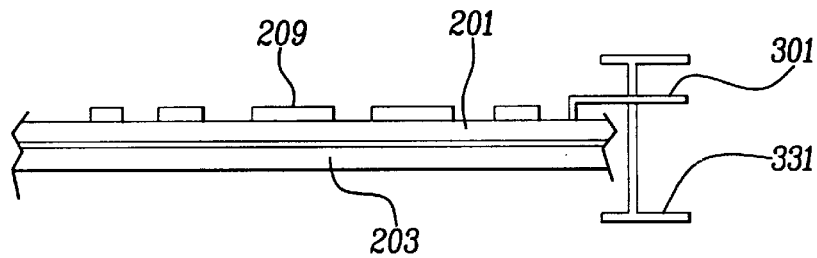
FIG. 6 is a diagrammatic cross sectional view, taken along line 6—6 of FIG. 5, showing the circuit board layers and electronic components employed in the preferred embodiment window wiper motor system.

Referring to FIGS. 5 and 12, electronic components 209 are all mounted upon the traces of circuit board 201. More specifically, four transistors U2 through U5 are employed to drive electric motor 51 through leads Ml. A diode D4 is also provided to protect U2 through U5 against reverse battery voltage. Another transistor U6 is employed to switch the heated back light function. Furthermore, a varistor VAR1, various capacitors referenced by prefix C, inductors referenced by the prefix L, and jumpers designated by prefix J, are also used. Xl designates the crystal for setting the proper frequency. These electronic components inwardly project toward the main gear to save space. However, it may be desirable to close JU1 and JU4 P2-P4, and open JU2, JU3, and JU4 P1-P3 in a production type setting. Furthermore, JU1 should be open, J2 should be closed, JU4 P2-P4 should be open and JU4 P1-P3 should be closed, to operate the heated back light using the disclosed software. Moreover, to operate the Ul disable function given the disclosed software, JU3 should be closed.

Referring now to FIGS. 5, 6, 8 and 9, fourteen 90° terminals 301 are mounted on terminal pads 225 of circuit board 201 for mating with a body wire harness. Terminals 301 are preferably stamped from a phosphor-bronze metal alloy which can be obtained from Autosplice Co.; terminals 301 have a flat blade configuration. Terminals 1 through 7 have double leg fastening to circuit board 201 while terminals 8 through 14 have single leg fastening. First, blind holes are drilled in gear cover 203. Next, the holes are filled with non-conductive material to prevent the subsequently inserted terminals from shorting against gear cover 203. Third, circuit board 201 is laminated to gear cover 203, and then terminal holes are drilled in circuit board 201 and the filler material. Finally, the terminals are mounted to circuit board 201. However, surface mounting of the terminals to eliminate drilling and filling of the gear cover prior to laminating would be preferred.

A female electrical connector 331 has a peripherally slotted elastomeric seal 333 which fits within a squared notch 335 of gear housing 202. Distal ends of terminals 301 project through rectangular slots 337 of female electrical connector 331. Thus, terminals 301 are accessible from a thin side of central drive and power transmission unit 43 (see FIG. 2) thereby serving to significantly reduce the packaging thickness.

Figure 10:
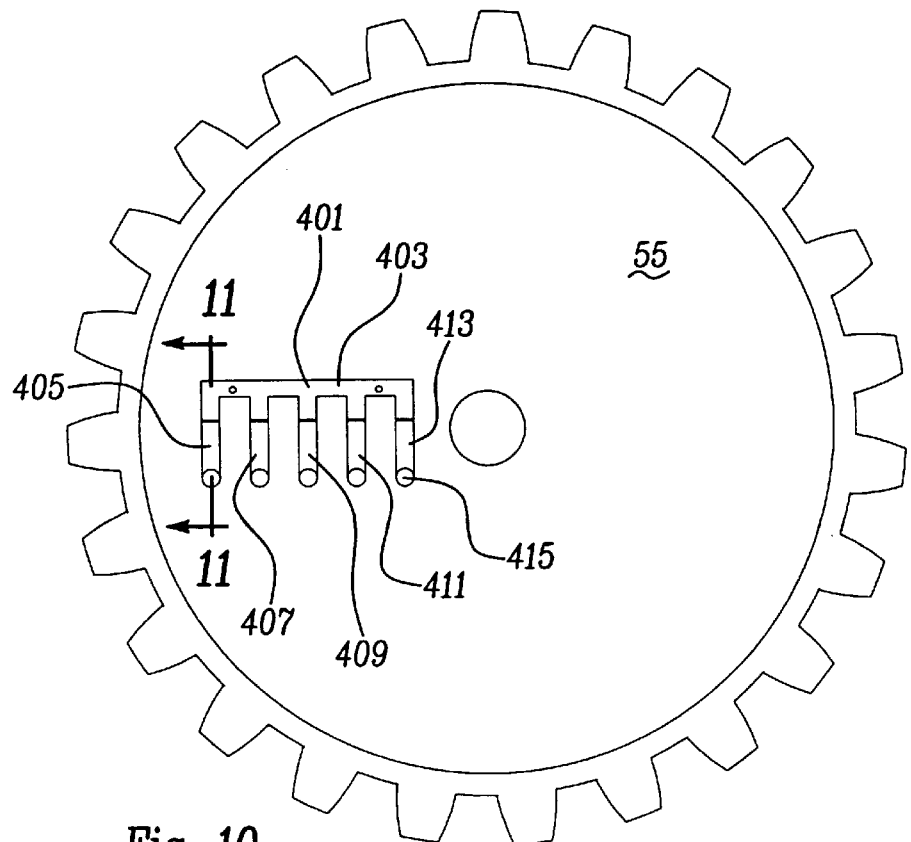
FIG. 10 is a diagrammatic front elevational view showing a main gear employed in the preferred embodiment window wiper motor system.
Figure 11:
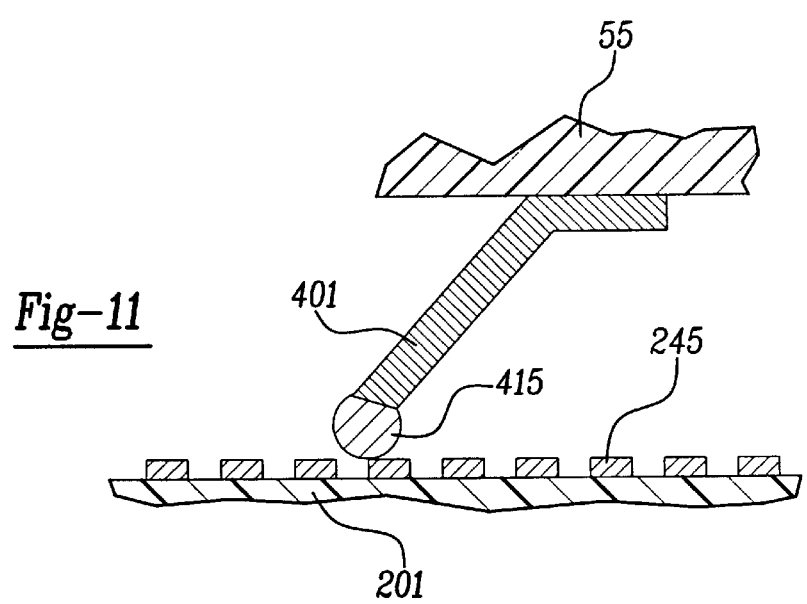
FIG. 11 is a cross sectional view, taken along line 11—11 of FIG. 10, showing an interface between the main gear and the circuit board layers employed in the preferred embodiment window wiper motor system.
Figure 12A:
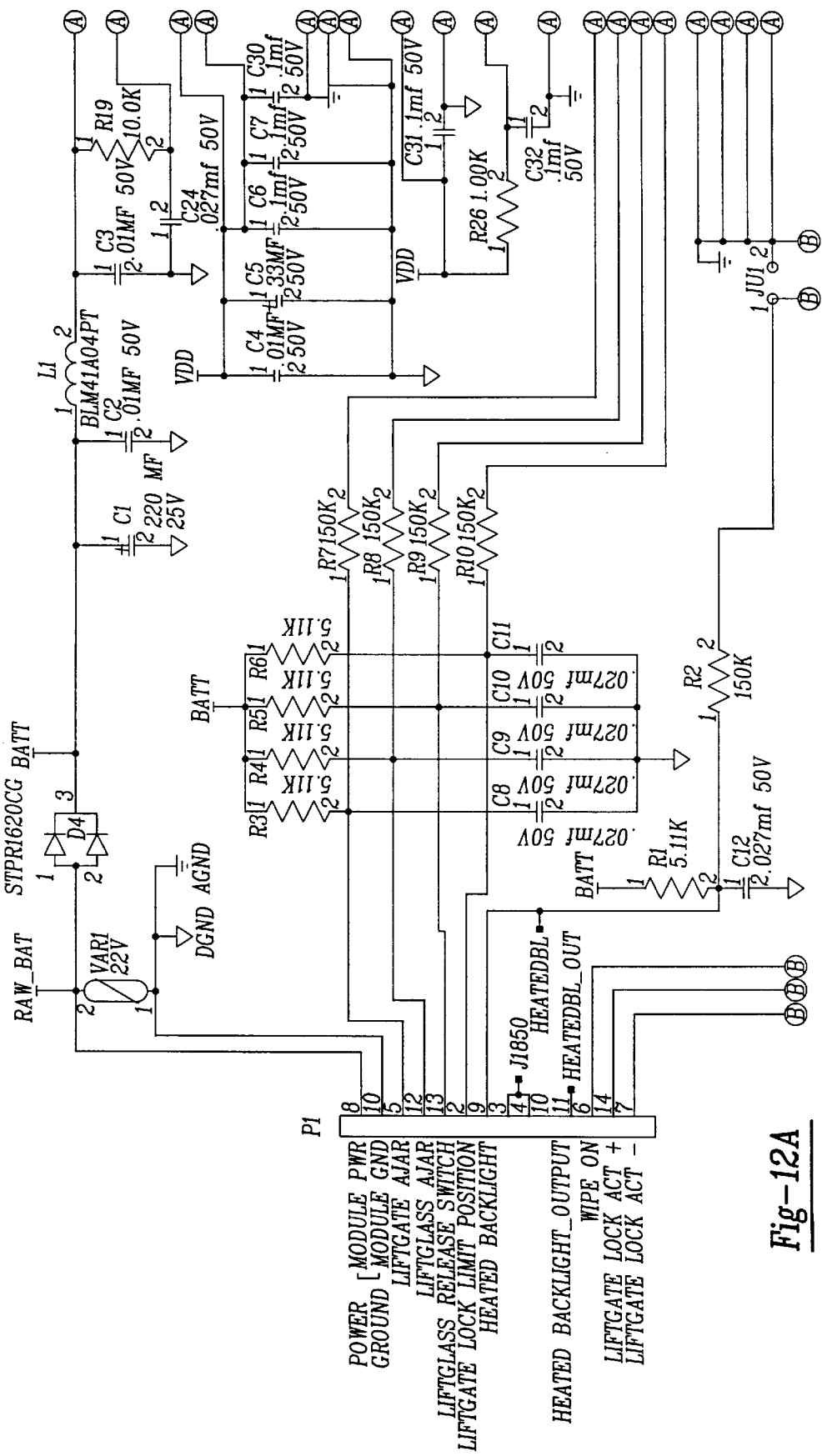
FIG. 12 is an electrical schematic of the preferred embodiment window wiper motor system.
Figure 12B:
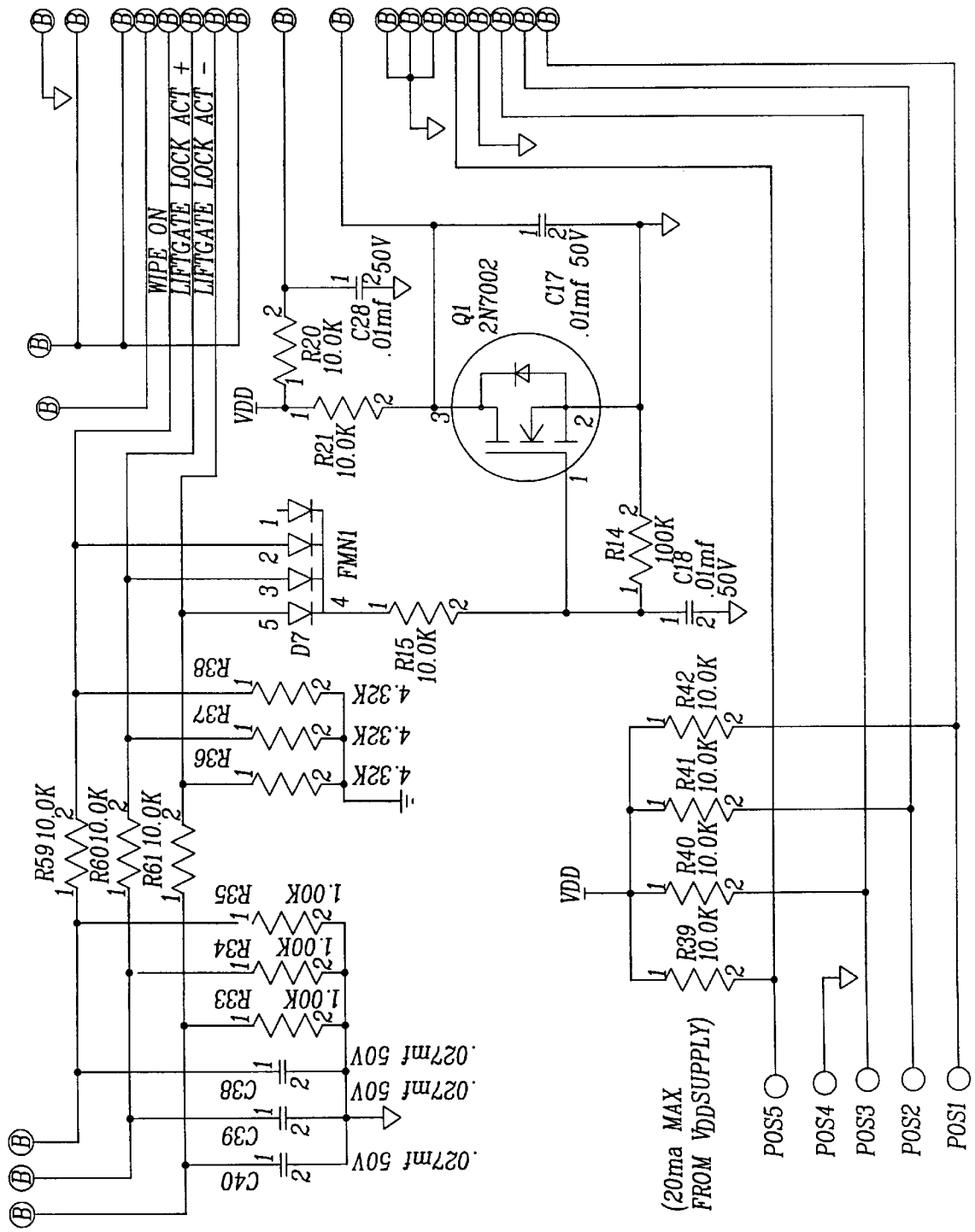
Figure 12C:
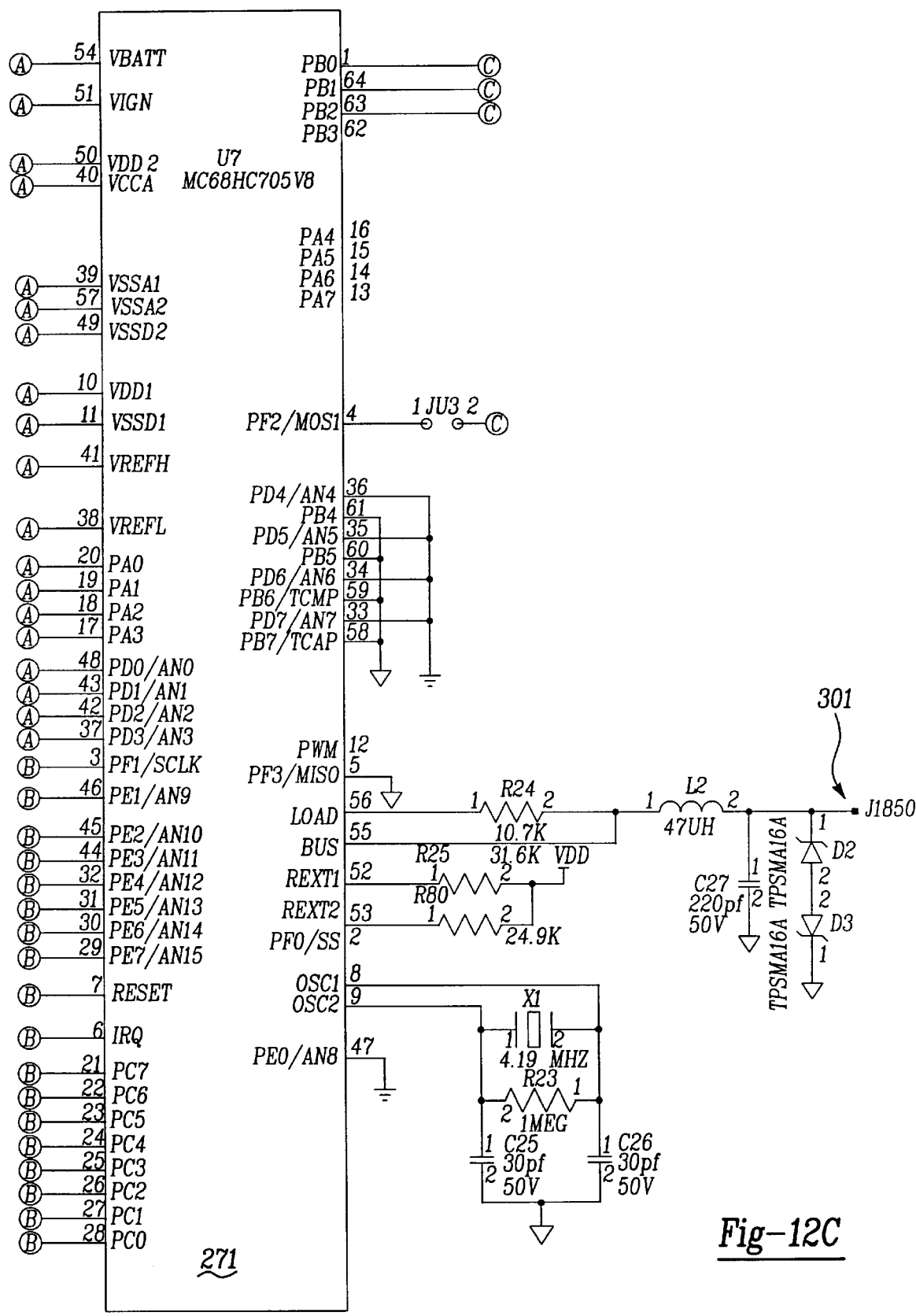
Figure 12D:
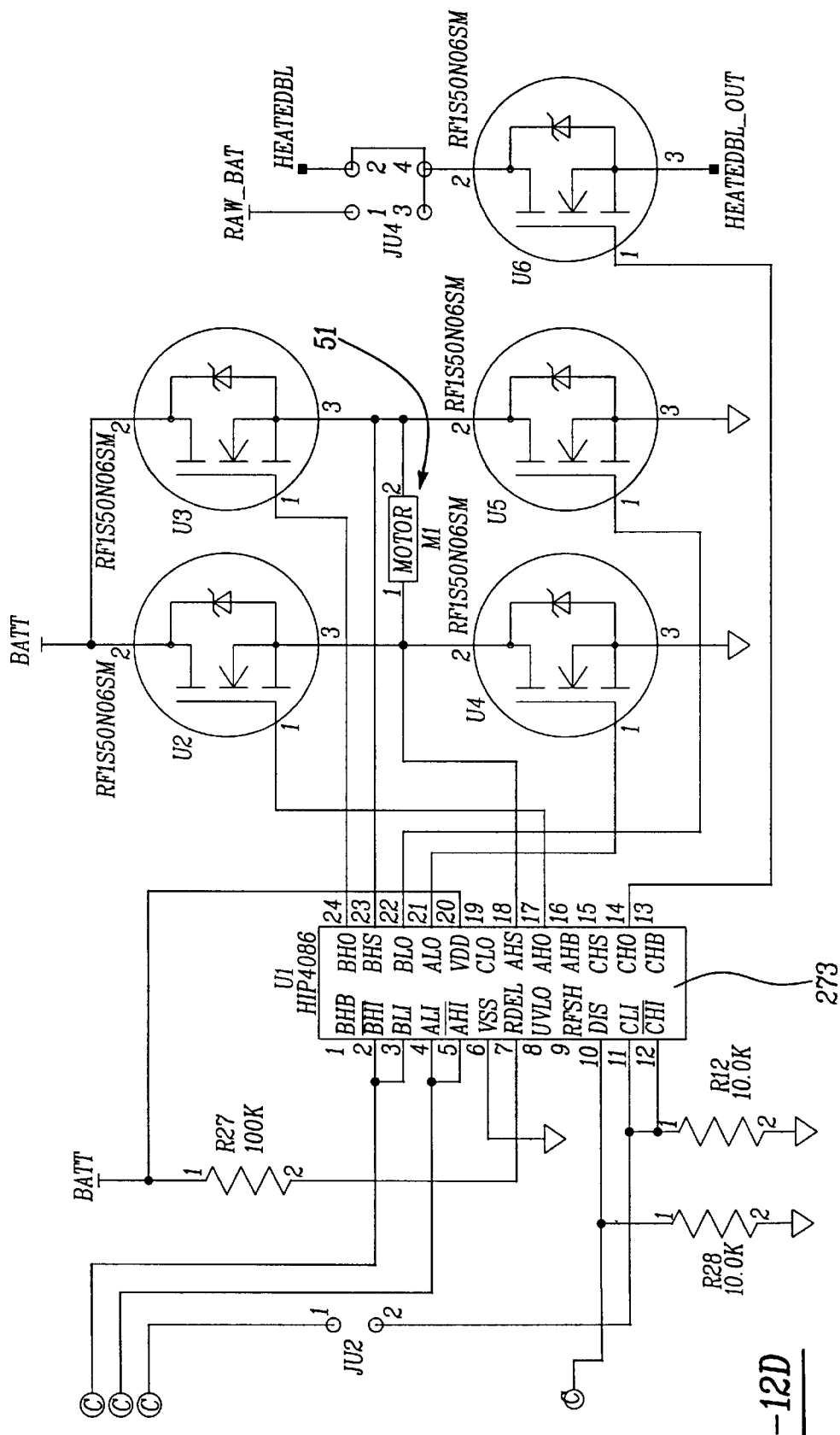

The interface between main gear 55 and feedback pattern 231 of circuit board 201 may best be seen with reference to FIGS. 10 through 12. A stamped beryllium copper shorting bar 401 includes a base 403, heat staked onto polymeric gear 55, and five bent fingers 405, 407, 409, 411 and 413 corresponding to POS5, POS3, POS2, POS1 and POS4, respectively. A silver coated contact ball 415 or stamped dome on each finger serves to ride against and conduct electricity through the corresponding conductive trace or tic 245.

FIG. 12 further shows main microprocessor 271 as a Motorola MC68HC705V8 microprocessor and transistor driving integrated circuit 273 as a three phase Harris HIP4086 component using three high side and three low side drivers. Furthermore, Liftgate Lock ACT receives sensor inputs from the old actuator leads (since the liftgate motor or solenoid has been deleted with the present invention). Additionally, a liftgate ajar, liftglass ajar, liftglass release switch, liftgate lock limit position and heated back light switches are all standard on/off type switches that are grounded. Moreover, electrical connector 301 is electrically connected to a main body controller or microprocessor in a multiplexed manner using an SAE J1850 multiplex (MUX) protocol, an SAE J2178 multiplex message strategy, and an SAE J2190 multiplex diagnostic standard within the rear node circuits; CAN or other MUX protocols can also be used. It is also important that the present invention employs semiconductors and an H-bridge MOSFET configuration rather than relays in order to increase reliability, provide variable speed motor control and reduce the packaging size. The transistors are all 20 milliohm N-channel Harris MOSFETs. A courtesy lamp (not shown) can also be controlled by the rear node circuitry; the rear node, main microprocessor can be programmed to provide an automatic delay lamp off feature after a predetermined time from closure of the rear liftgate or if the lamp is inadvertently left on for a predetermined period of time.

The operation and programmable software logic used to operate the preferred embodiment control system of the present invention will now be described in detail. The rear node, main microprocessor of the preferred embodiment control system of the present invention is operated by a main software program, a portion of which is shown in the flow diagram of FIG. 13. When power is applied through the ignition switch, the rear node, main microprocessor first tests and clears the random access memory (RAM), tests the read only memory (ROM), performs a check sum function, initializes the J1850 hardware and clears the input and output ports while setting up the input and output direction. The main microprocessor then enables the timer and interrupts, enters a low power stop mode and then determines whether external interrupts are detected. If external interrupts are detected, the main microprocessor initializes the system timer, enables the input task and enables the J1850 task. The rear node, main microprocessor then determines if it needs to run the J1850 subroutine; if yes, the J1850 subroutine is run. If no, the main microprocessor then determines if it needs to run the electric motor subroutine; if yes, the electric motor subroutine is run. If no, the rear node, main microprocessor determines if it needs to run the lamps subroutine; if yes, the lamps subroutine is run. If no, the rear node, main microprocessor then determines if it needs to run the heated back light subroutine; if yes, the heated backlite subroutine is run. If no, the main microprocessor determines if it needs to run the inputs subroutine; if yes, the main microprocessor runs the inputs subroutine. If no, or upon completion of the inputs subroutine, the rear node, main microprocessor returns to determining the need to run the J1850 subroutine.

Figure 13:
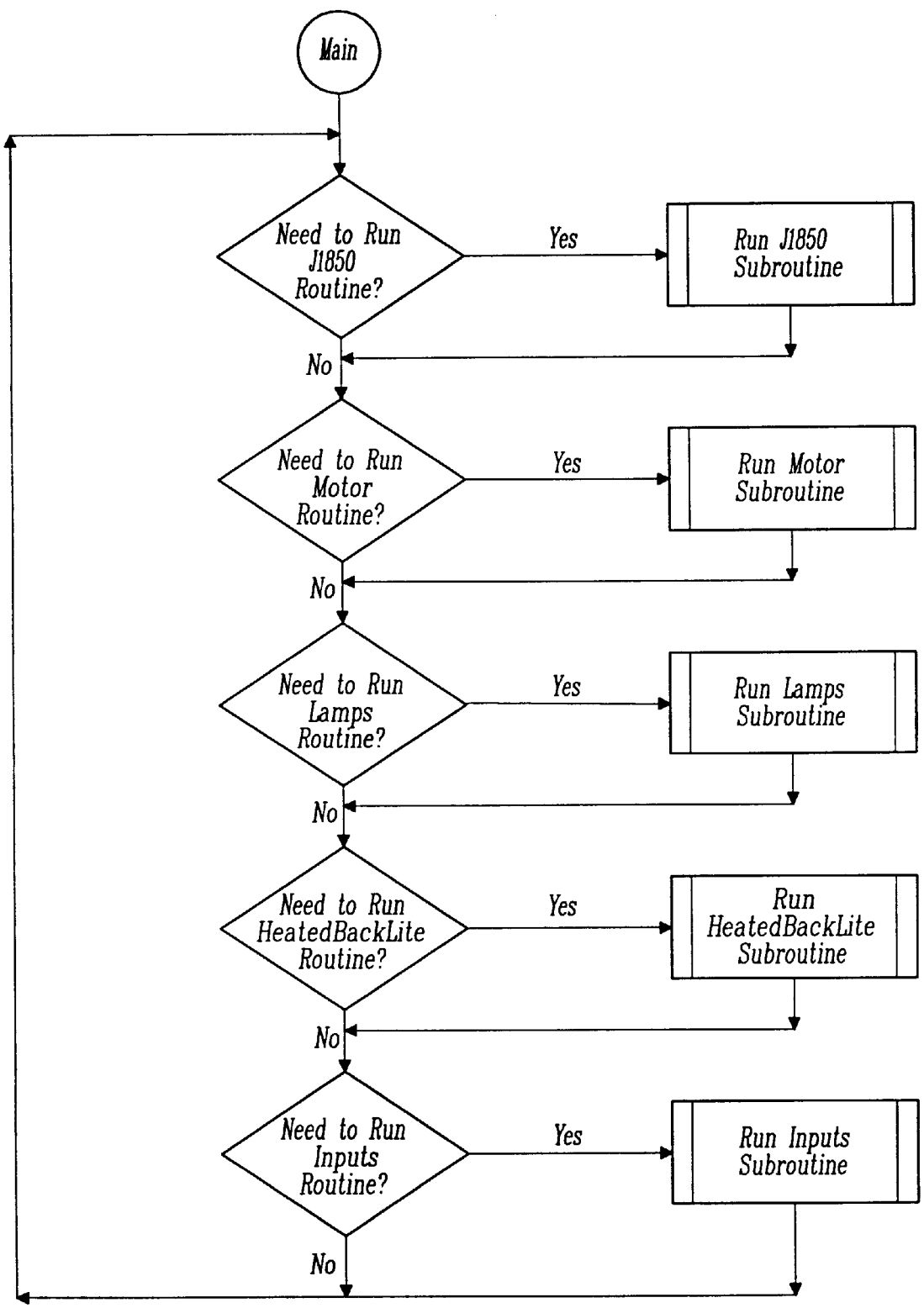
FIGS. 13 through 15 are flow diagrams showing a main microprocessor software program employed with the preferred embodiment window wiper motor system.
Figure 14:
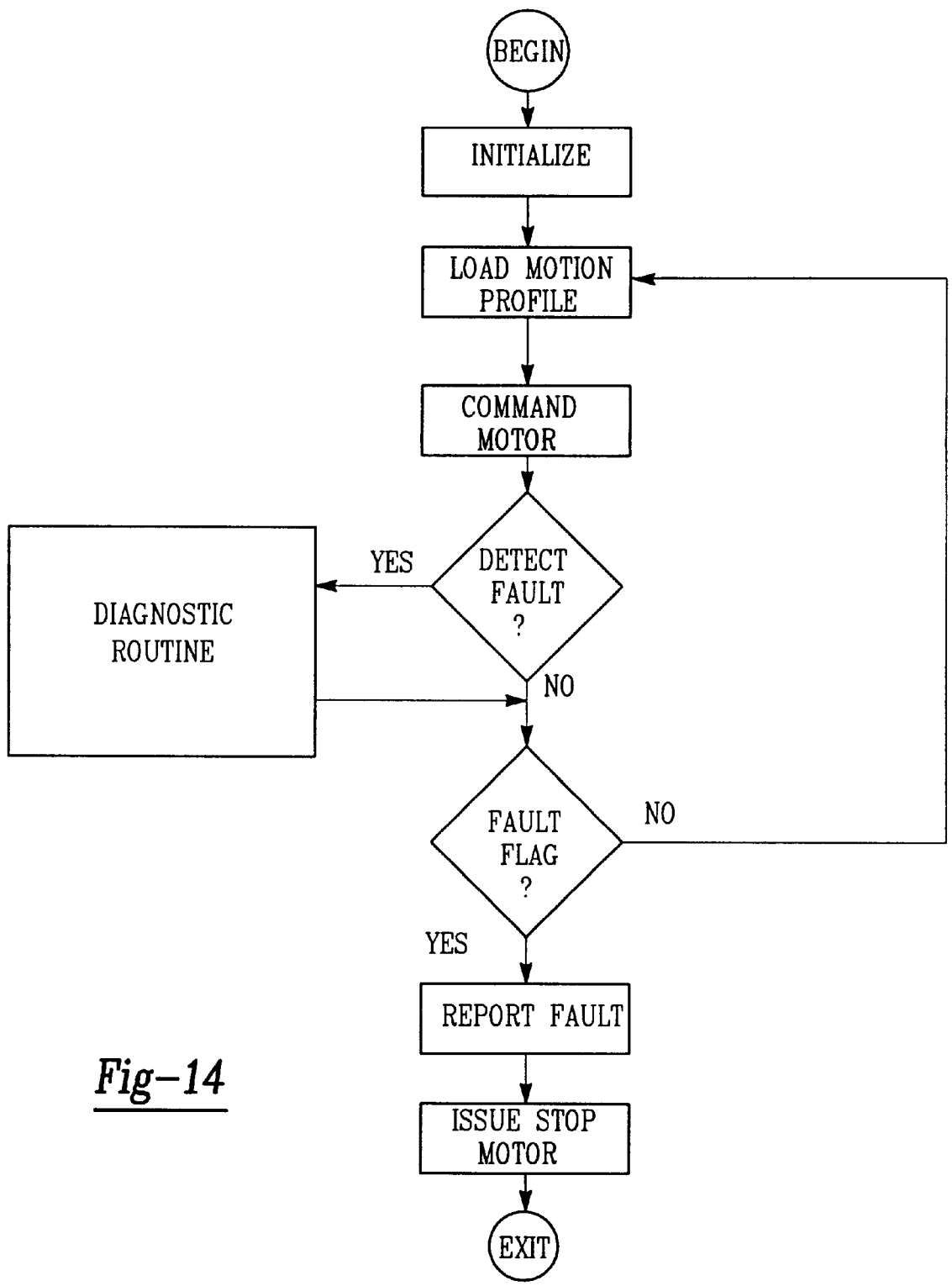

FIG. 14 shows the software loops for the new features resulting from the incremental feedback pattern and code expressed within the Run Motor Subroutine of FIG. 13. The incremental feedback code Run Motor Subroutine is first initialized and then the selected Motion Profile of FIGS. 16 through 19 is loaded. Next, the appropriate electrical signal is given to the electric wiper motor as part of the Command Motor operation thereby causing the motor to drive the main gear, intermittent motion mechanism and wiper shaft at the desired speed and/or sweep distance. A Detect Fault decision is made based upon detected deviations of the motion profile beyond acceptable limits. If yes, a Diagnostics Routine is executed to identify or rectify the fault. An unrectified fault condition sets the Fault Flag. A Fault Flag decision is subsequently made and if no Fault Flag is found, then the loop will return to the Load Motion profile operation. If a Fault Flag is found, then the subroutine will report the fault and issue a Stop Motor command.

Figure 15:
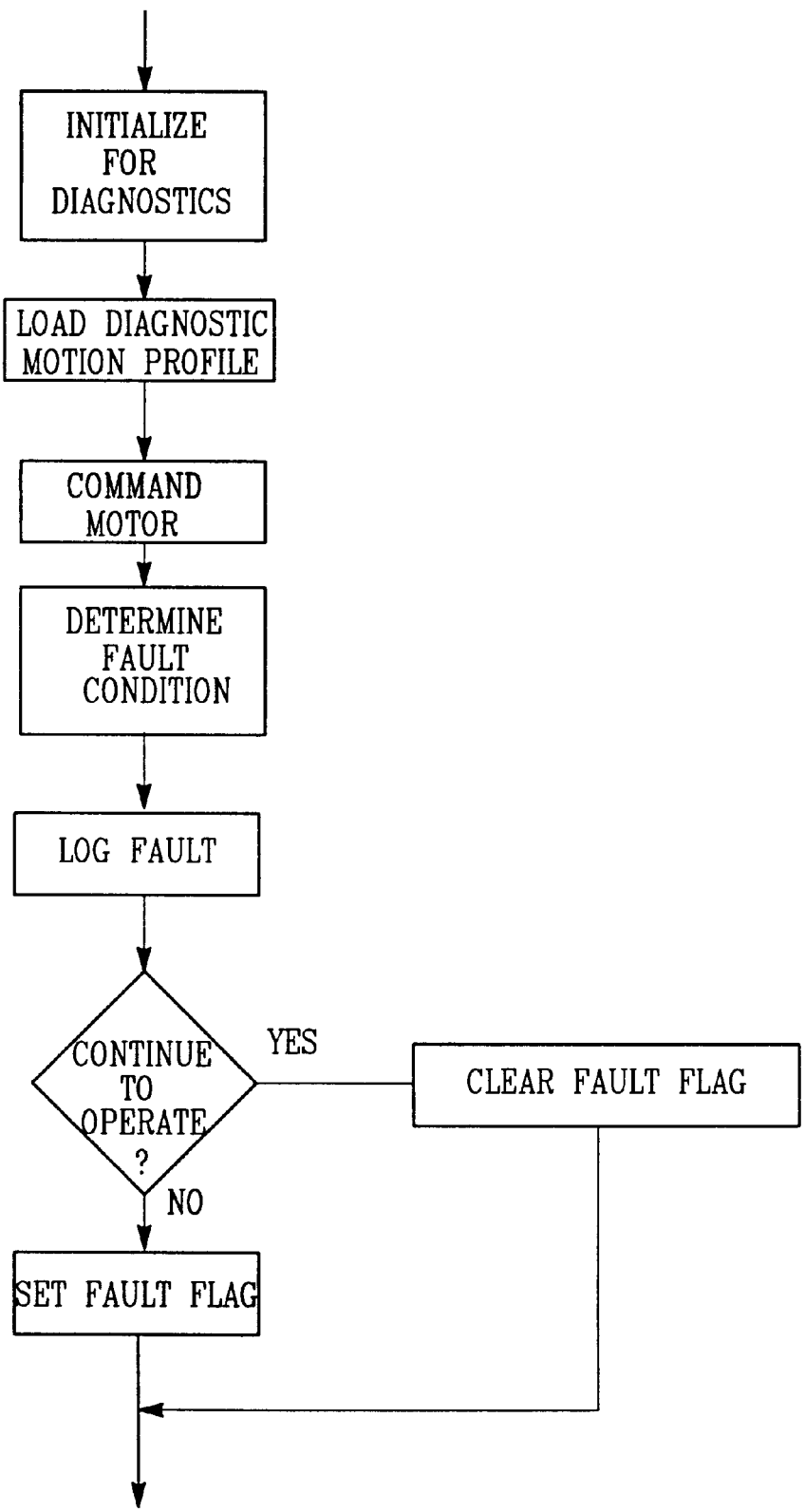

FIG. 15 discloses the Diagnostics Routine wherein the diagnostics step is initialized, the Diagnostic Motion Profile is loaded and the Command Motor step is performed. Next, a Determine Fault Condition operation is commenced and a Log Fault step is employed. Subsequently, a Continue to Operate decision is made: if yes, a Clear Fault Flag step is performed; if no, a Set Fault Flag operation is performed.

Figure 16:
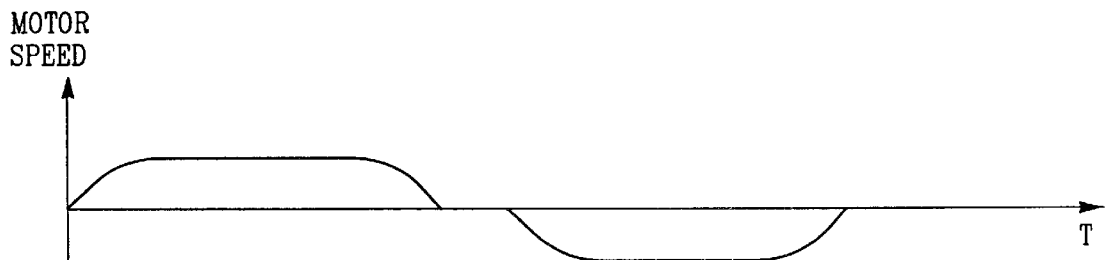
FIGS. 16 through 19 are diagrams showing exemplary wiper motion profiles employed with the preferred embodiment window wiper motor system.

FIG. 16 illustrates an exemplary soft start motion profile. The tics of the feedback pattern on the circuit board generate electrical pulses which are conducted through the shorting bar and counted by the rear node, main microprocessor. This allows the microprocessor to determine the rate of angular travel or velocity of the main gear rotation, and corresponding wiper movement when the wiper intermittent motion mechanism is operably driven. Therefore, the microprocessor uses this incremental feedback code to slowly ramp up the motor speed at the beginning and end of the wiper sweep travel in both the clockwise and counterclockwise directions while maintaining a generally flat, steady state speed through the middle range of movement in both the clockwise and counterclockwise sweep directions. This speed varying function prevents inadvertent gear teeth failure and wiper blade-to-arm failure when the inertia of the wiper mechanism would otherwise continue past the end of its travel even when the motor has reversed direction. This also serves to prevent the inertia of the wiper assembly and drive train from allowing the wiper blade to forcibly contact against the painted vehicle body or exterior trim strips at the end of the wiper sweep.

Figure 17:
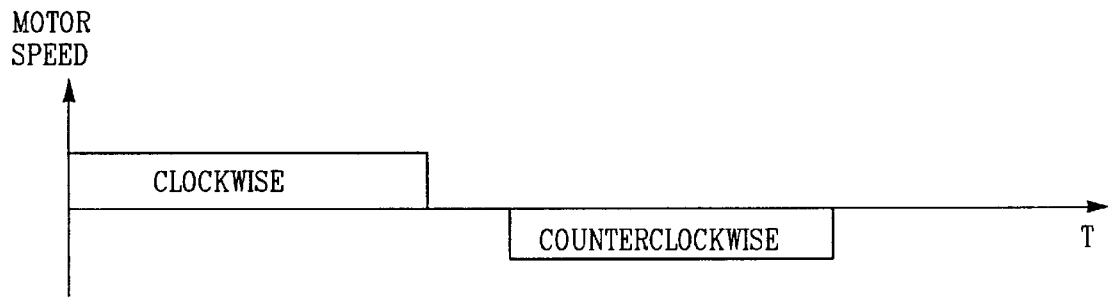

FIG. 17 discloses a normal, constant speed wiper profile employing essentially instantaneous on/off ramp up and ramp down clockwise and counterclockwise wiper speeds with abrupt interval dwell times between reverse sweeps. The interval dwells, however, can be easily varied by merely using software and the incremental feedback code as a function of time.

Figure 18:
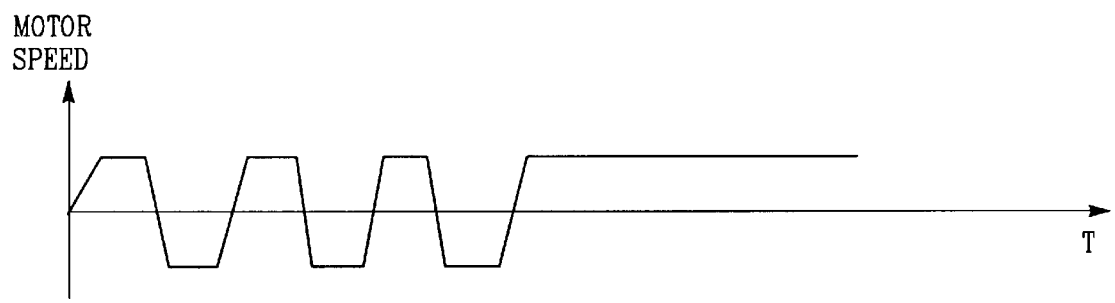

FIG. 18 shows a jog/jam profile used to break ice on the window. A quickly inclining and declining ramp up and ramp down energization of the motor is employed to quickly and locally oscillate the sweep of the wiper over the sensed area. The ice is sensed in a real time manner due to the slow down of the wiper in this area beyond that intended. After the localized oscillation function has been completed, a normal clockwise and counterclockwise steady state condition is employed.

Figure 19:
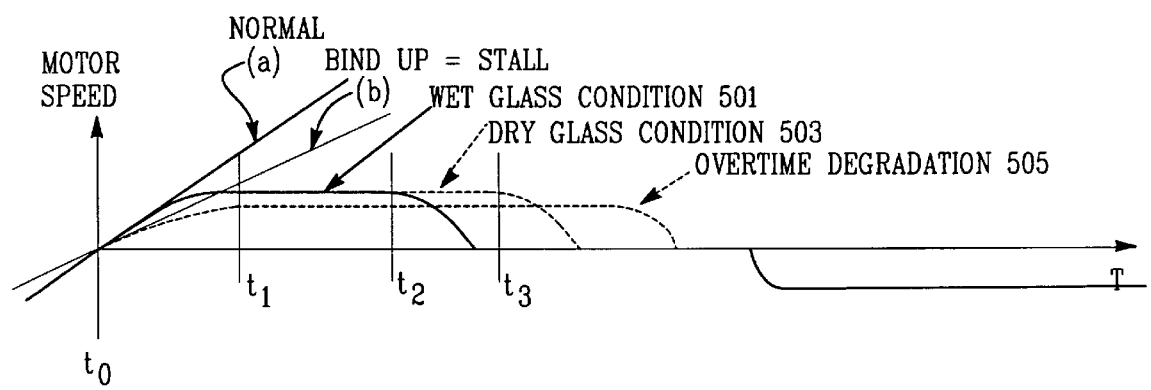

The glass condition or fault deviation profiles are illustrated in FIG. 19. Line (a) is the desired start slope for the normal variable speed ramp up condition. The binding or stall condition is indicated by line (b) which is the degraded start slope.

The solid line 501 indicates a wet glass condition, the faster speed dashed line 503 indicates a dry glass condition while the lower speed dashed line 505 is indicative of a degraded system condition over time. Such a lifetime degradation can be caused by a lack of lubrication or failure of bearings within the motor. The profiles of FIG. 19 are employed to sense the wiper performance on a real time, automatic and continuous basis. The automatic interval selection can be based upon the change in wipe time from dry conditions ($t_3-t_1$) or wet conditions ($t_2-t_1$). If $t_{dry}=t_{3-t1}$, and $t_{wet}=t_2-t_1$, then $t_{wet}<t_{wipe}<t_{dry}$ (bounded $t_{wipe}$), and $t_{interval}=f(t_{wip})$ (where the interval is a function of $t_{wipe}$).

Figure 20:
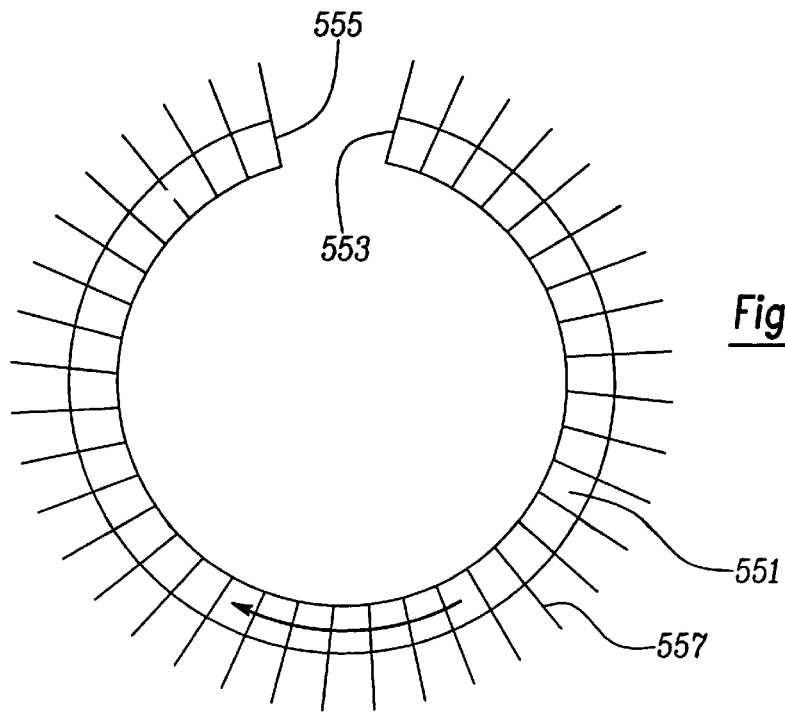
FIG. 20 is a diagrammatic true elevational view showing an analog circuit board feedback pattern employed in a first alternate embodiment of the window wiper motor system.

An alternate embodiment of the feedback pattern can be observed in FIG. 20. A resistive feedback ring 551 has a circular shape broken at its ends. Feedback pattern 551 has an increased resistance from end 553 to opposite end 555. A series of outwardly radiating tics 557 are connected to feedback pattern 551. This incremental resistive feedback loop 551 allows for use of an analog control circuit which provides for discrete step variable sensing, speed control and programmable distance control. The sensed resistance determined at a specific location is a function of the maximum resistance over the counted number of tics. Direct contact with the resistive material, instead of tics, would give infinitely variable measurement.

Figure 21:
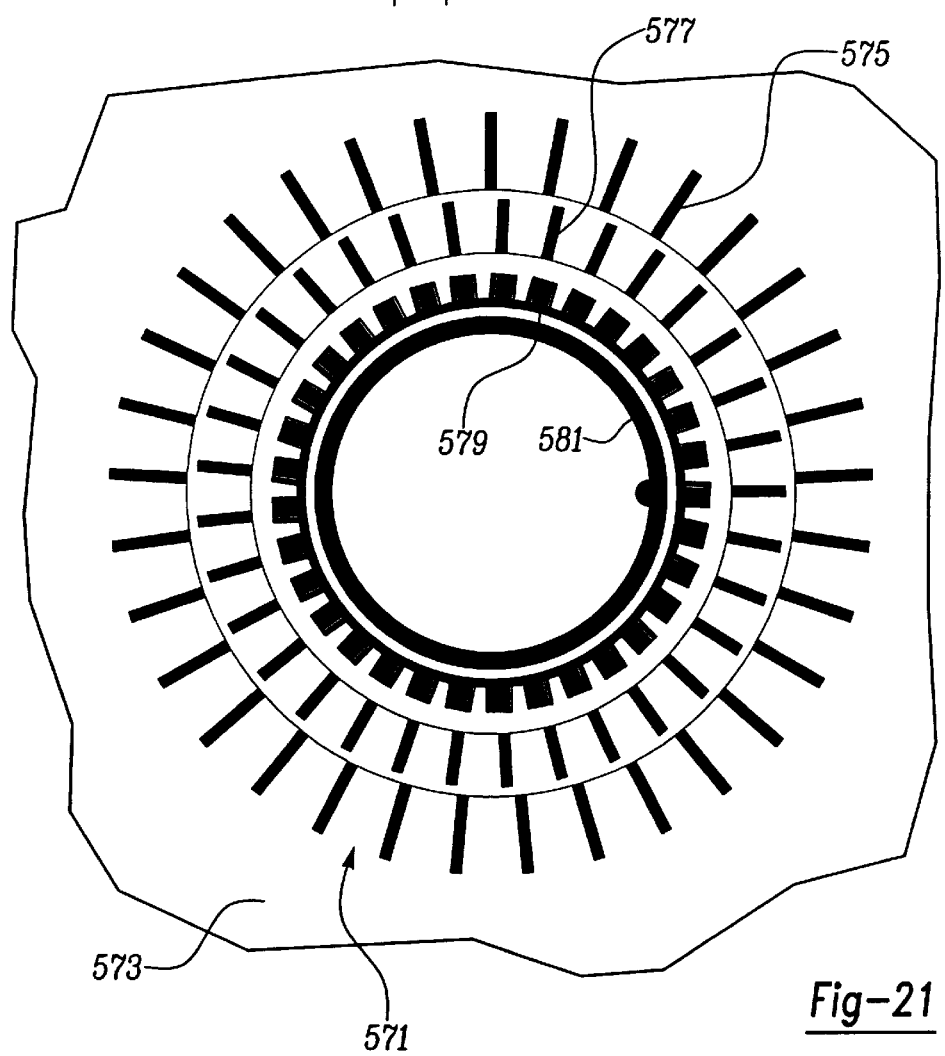
FIG. 21 is a diagrammatic true elevational view showing a fully digital circuit board feedback pattern employed in a second alternate embodiment of the window wiper motor system.

Referring to FIG. 21, another alternate embodiment feedback pattern 571 is employed on a printed circuit board 573 for use with a fully digital encoder. Three or more concentric intermittent tic rings 575, 577 and 579 contain tics slightly offset from each other. An annular grounding ring 581 is also employed. This allows for very fine position sensing, speed sensing and control of the wiper without need for analog measurement.

While the preferred embodiment of this window wiper motor system has been disclosed, it will be appreciated that various modifications may be made without departing from the present invention. For example, the feedback pattern may have differing configurations, shapes, and sizes. The incremental feedback pattern and software can also be employed in more conventional window wiper motors that do not employ the preferred intermittent motion mechanisms. Alternately, a ceramic dipped, low carbon steel gear cover which contains a screened on conductor, can be employed in place of the disclosed laminated integral printed circuit board and gear cover assembly. The preferred electronic components and electrical circuits may also be varied in other analog and digital control arrangements as long as the disclosed functions are achieved. It is further envisioned that a hall effect sensor or potentiometer could also be employed with the laminated circuit board and cover arrangement. While various materials have been disclosed, a variety of other materials may also be used. It is intended by the following claims to cover these and other departures from the disclosed embodiments which fall within the true spirit of this invention.

The invention claimed is:

1. A system for use in an automotive vehicle, said system comprising:

an electric motor;

a gear enclosure;

a gear located in said gear enclosure and operably rotating in response to energization of said electric motor;

a circuit board located in said gear enclosure;

a microprocessor mounted to said circuit board in a flip chip manner, said microprocessor controlling energization of said electric motor; and a shaft rotatably driven by said gear.

2. The system of claim 1 wherein said microprocessor acts as a multiplexing node.

3. The system of claim 1 further comprising a semiconductor H-bridge being electrically connected to and controlling said electric motor, said microprocessor electrically driving said semiconductor H-bridge.

4. A method of operating a window wiper motor system, said method comprising:

(a) determining an incremental position of a member moving with a window wiper between ends of wiper sweep travel by sensing the actual position of said member relative to a stationary reference;

(b) determining the speed of movement of said member in response to said incremental position determination; and (c) automatically varying the speed of said member, including amounts greater than zero, through variable energization of an electric motor which drives said member in response to said speed determination.

5. The system of claim 1 wherein said shaft is a window wiper shaft.

* * * * *